United States Patent [19]

Fuchs

[11] Patent Number: 4,833,343
[45] Date of Patent: May 23, 1989

[54] CLOCK GENERATOR HAVING COMPLEMENTARY TRANSISTORS

[75] Inventor: Hans P. Fuchs, Munich, Fed. Rep. of Germany

[73] Assignee: Siemens Aktiengesellschaft, Munich, Fed. Rep. of Germany

[21] Appl. No.: 202,800

[22] Filed: Jun. 3, 1988

[30] Foreign Application Priority Data

Jun. 10, 1987 [DE] Fed. Rep. of Germany ....... 3719360

[51] Int. Cl.[4] ........................ H03L 1/00; H03L 27/04; H03L 29/94; H03K 3/013
[52] U.S. Cl. .................................. 307/296.2; 307/269; 307/296.8
[58] Field of Search ..................... 307/269, 296 R, 297, 307/304, 296.2, 594, 597, 579

[56] References Cited

U.S. PATENT DOCUMENTS

| | | | |
|---|---|---|---|
| 4,092,548 | 5/1978 | Beilstein, Jr. et al. | 307/205 |
| 4,378,506 | 3/1983 | Taira | 307/297 |
| 4,438,346 | 3/1984 | Chuang | 307/297 |
| 4,460,835 | 7/1984 | Masuoka | 307/296 R |

*Primary Examiner*—Stanley D. Miller
*Assistant Examiner*—Nancy Thai
*Attorney, Agent, or Firm*—Herbert L. Lerner; Laurence A. Greenberg

[57] ABSTRACT

A generator circuit in an integrated semiconductor circuit for generating a clock voltage having a voltage being raised with respect to a supply potential of the generator circuit includes a first CMOS inverter having an input connected to a first clock signal and having an output carrying a clock voltage as an output signal of the generator circuit. A second CMOS inverter has an input connected to a second clock signal and has an output. The inverters have transistors of a first conduction type with source terminals. A transfer transistor of the first conduction type is connected between the source terminals and a supply potential. A capacitor is connected between the source terminals and a pump signal. The transfer transistor has a gate terminal connected to the output of the second CMOS inverter.

7 Claims, 2 Drawing Sheets

CLOCK GENERATOR HAVING COMPLEMENTARY TRANSISTORS

BACKGROUND OF THE INVENTION

The invention relates to a generator circuit in an integrated semiconductor circuit for generating a clock voltage, which has a voltage that is raised with respect to a supply potential of the generator circuit.

Generator circuits of this generic type are used, for instance, in integrated semiconductor memories, especially DRAMs, as so-called word line voltage generators. The purpose of such generator circuits in DRAMs, for instance, is to make a clock voltage available which is higher than the supply voltage of the entire circuit configuration, by at least the amount of the threshold voltage of the selection transistors of the memory cells. Typically, this clock voltage is raised by the amount of one-half the supply voltage. For instance, this makes it possible to write-in a logical 1 as data to be stored in a selected memory cell at its full voltage level, or in other words not after having been reduced, for instance, by the amount of the aforementioned threshold voltage.

For instance, two series-connected n-channel transistors have heretofore been used for this purpose. However, such a circuit requires doubly raised voltages, as will be explained below. These voltages carry the danger of voltage breakdown and damage to the semiconductor material.

OBJECTS OF THE INVENTION

It is accordingly an object of the invention to provide a generator circuit, which overcomes the hereinaforementioned disadvantages of the heretofore-known devices of this general type and which does not require these doubly raised voltage values.

SUMMARY OF THE INVENTION

With the foregoing and other objects in view there is provided, in accordance with the invention, a generator circuit in an integrated semiconductor circuit for generating a clock voltage having a voltage being raised with respect to a supply potential of the generator circuit, comprising: a first CMOS inverter having an input connected to a first clock signal and having an output carrying a clock voltage as an output signal of the generator circuit; a second CMOS inverter having an input connected to a second clock signal and having an output; the inverters having transistors of a first conduction type with source terminals, a transfer transistor of the first conduction type connected between the source terminals and a supply potential, and a capacitor connected between the source terminals and a pump signal; the transfer transistor having a gate terminal connected to the output of the second CMOS inverter.

In accordance with another feature of the invention, each of the transistors of the first conduction type have a substrate region connected to the source terminal thereof.

In accordance with a further feature of the invention, each of the transistors of the first conduction type have substrate regions connected to a trough voltage being at least as high as the maximum potential occurring in the generator circuit.

In accordance with a added feature of the invention, the inverters also have other transistors of a second conduction type opposite to the first conduction type, the other transistors having interconnected substrate regions and source terminals.

In accordance with an additional feature of the invention, the inverters also have other transistors of a second conduction type opposite to the first conduction type, the other transistors having substrate regions connected to a separate substrate bias voltage.

In accordance with yet another feature of the invention, the inverters also have other transistors of a second conduction type opposite to the first conduction type, the transistors of the second conduction type each having a substrate with a trough of the first conduction type therein, and each of the transistors of the first conduction type having substrate regions disposed in the trough.

In accordance with a concomitant feature of the invention, the transistors of the first conduction type each have a substrate with a trough of a second conduction type opposite the first conduction type therein, and the inverters also have other transistors of the second conduction type having substrate regions disposed in the trough.

Other features which are considered as characteristic for the invention are set forth in the appended claims.

Although the invention is illustrated and described herein as constructed in a generator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
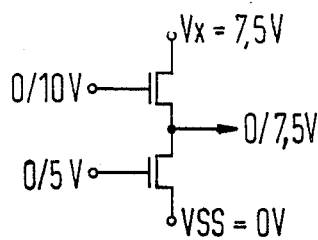
FIG. 1 is a schematic circuit diagram of a prior art generator circuit.

Referring now to the figures of the drawings in detail and first, particularly, to FIG. 1 thereof, there is seen a prior art generator circuit having two series-connected n-channel transistors. The transistors and disposed between a reference voltage VSS (such as 0 V) and a voltage Vx (such as 7.5 V) that is raised above a supply voltage VDD (such as 5 V).

A clock voltage V, which has levels of VSS or Vx (depending on the switching state) is formed as an an output between the two transistors. While one transistor is operated with typical levels of the reference voltage VSS and the supply voltage VDD at the gate thereof, the level of the reference voltage VSS and a voltage which is raised even further than the clock voltage Vx, for instance twice the supply voltage VDD (such as 10 V), are alternately applied to the gate of the other transistor.

This further raised voltage thus attains the order of magnitude of the breakdown voltage of the diodes disposed between the n+ diffusion zones and the p substrate of the transistors (assuming n-channel technology). The danger of voltage breakdown and damage to the semiconductor material therefore exists.

Figure 2:
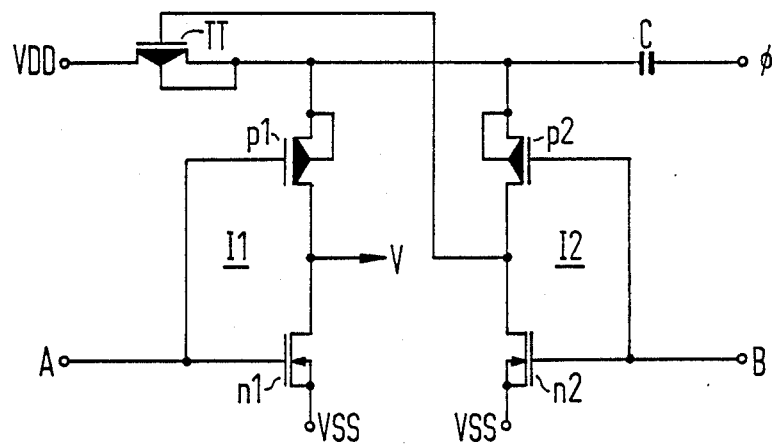
FIGS. 2-4 are schematic circuit diagrams of embodiments of the invention.

The embodiment according to the invention shown in FIG. 2 has two CMOS inverters I1, I2. The input of the first CMOS inverter I1 is connected with a first clock signal A. The output of the first CMOS inverter I1 carries a generated clock voltage V of the generator circuit. The input of the second CMOS inverter I2 is connected with a second clock signal B. As usual, each inverter I1, I2 contains a transistor p1, p2 of a first conduction or conductivity type and a transistor n1, n2 of a second conduction or conductivity type. In this case, the first conduction type is assumed to be p-channel, while the second type is correspondingly assumed to be n-channel. The relationship can also be the reverse, taking into account the electrical conditions.

While the source terminals of the transistors n1, n2 of the second conduction type are connected with the reference potential VSS in the typical manner, the source terminals of the transistors p1, p2 of the first conduction type are connected to the supply potential VDD through a transfer transistor TT, which is again of the first conduction type. The source terminals of the transistors p1, p2 are also connected through a capacitor C to a pump signal 0. The gate of the transfer transistor TT is connected to the output of the second CMOS inverter I2.

Figure 5:
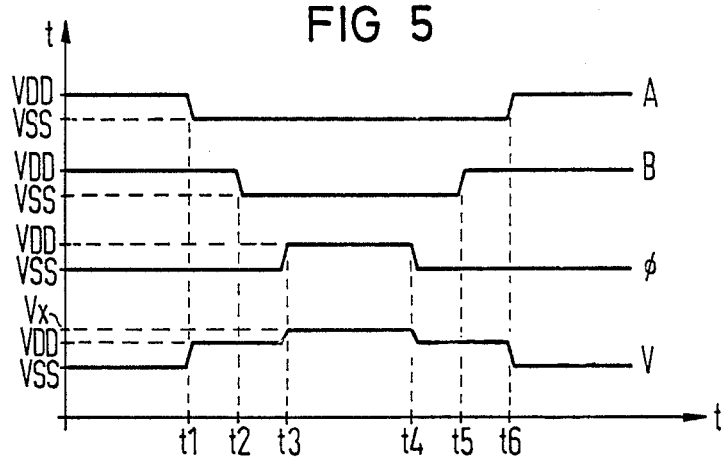
FIG. 5 is a timing diagram.

The function of this circuit is best explained by referring to the timing diagram of FIG. 5: Up to a time t1, the clock voltage V which is the output of the first inverter I1 is at logical 0 corresponding approximately to VSS, because of the first clock signal A. The transfer transistor TT is conductive up to a time t2 because of the second clock signal B. As a result, the sources of the transistors p1, p2 of the inverters I1, I2 which are of the first conduction type are correspondingly precharged to logical 1 corresponding approximately to supply potential VDD, up to the time t2.

Due to the first clock signal A, the clock voltage V has the supply potential VDD from the time t1 until a time t3. At the time t3 and thereafter, both transistors p1, p2 of the inverters I1, I2 which are of the first conduction type are conductive, because of the two clock signals A and B. Among other things, this means that the transfer transistor TT is blocked from the time t2. At the time t3, the pump signal 0 changes its state from logical 0 (approximately VSS) to logical 1 (approximately VDD). As a result, a load shift ("boosting") takes place through the capacitor C, in the direction beyond the supply potential VDD (since the charge cannot drain out toward the supply potential VDD through the blocked transfer transistor TT). Since the two transistors p1, p2 of the first conduction type are still conductive, the boosting affects both transistors p1, p2. The clock voltage V thus rises beyond the supply potential VDD to a value Vx, which is above the supply potential VDD by an amount on the order of magnitude of approximately one-half the supply potential VDD (that is, it is at approximately 7.5 V). A precise value for this depends on the supply potential VDD on one hand, and on the dimensioning of the entire circuit on the other hand.

At a time t4 the pump signal 0 changes to logical 0. The boosting is ended, and the output signal V again has the value of the supply potential VDD. At a time t5, the transfer transistor TT becomes conductive again, because of the second clock signal B. At a time t6, the initial state is resumed. The clock voltage V has the reference potential VSS, because of the first clock signal A.

Figure 3:
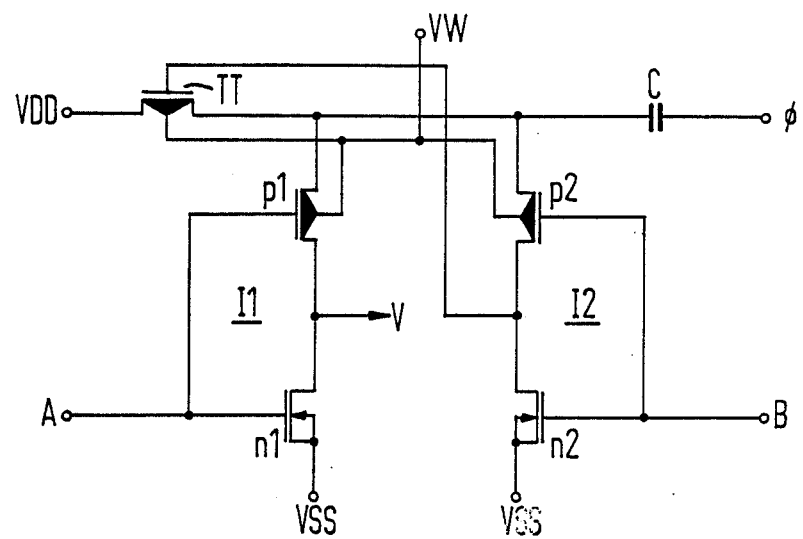

In the embodiment of FIG. 3, trough-like substrate regions (of a trough-like structure which is typical in CMOS technology) of the transistors p1, p2 of the inverters I1, I2 which are of the first conduction type as well as of the transfer transistor TT, are connected with a trough voltage VW, instead of being connected to the source of the respective transistor, as seen in FIG. 2. The trough voltage VW is at least as high as the maximum potential occurring in the circuit, which in the present case is at least as high as the aforementioned potential Vx of the clock voltage V.

In the embodiments of FIGS. 2 and 3 the substrate regions of the transistors of the second conduction type, that is the substrate regions of the n-channel transistors n1 and n2 of the inverters I1, I2 in the conduction type relationships selected in the figures, are connected to the source of the respective n-channel transistor n1, n2 and are typically at reference potential VSS. However, in the embodiment of Fig. 4 these substrate regions are connected to a separate substrate bias voltage VBB.

Figure 4:
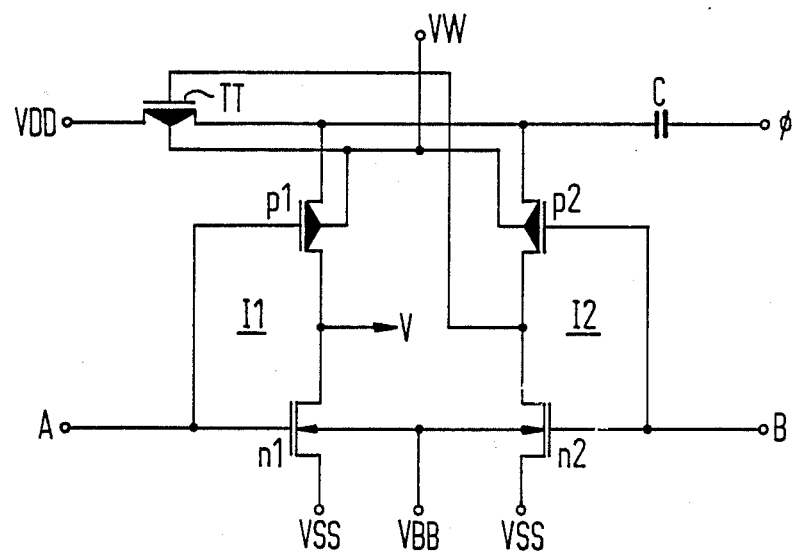

Although the present invention has been explained in terms of n-trough CMOS technology with regard to FIGS. 2-4, it will be readily apparent to one skilled in the art that this invention can also be reduced to practice by means of p-trough CMOS technology, with a corresponding variation of the circuit configuration, simply by applying suitable skills of one in the art to the present disclosure. For example, in FIG. 2, this can be done by exchanging the potentials VSS and VDD for one another and replacing the p-channel transistors with n-channel transistors.

The foregoing is a description corresponding in substance to German Application No. P 37 19 360.0, dated June 10, 1987, the International priority of which is being claimed for the instant application, and which is hereby made part of this application. Any material discrepancies between the foregoing specification and the aforementioned corresponding German application are to be resolved in favor of the latter.

What is claimed is:

1. Generator circuit in an integrated semiconductor circuit for generating a clock voltage having a voltage being raised with respect to a supply potential of the generator circuit, comprising: a first CMOS inverter having an input connected to a first clock signal and having an output carrying a clock voltage as an output signal of the generator circuit; a second CMOS inverter having an input connected to a second clock signal and having an output; said inverters each having transistors of a first conduction type with source terminals, a transfer transistor of the first conduction type connected between said source terminals and a supply potential, and a capacitor connected between said source terminals and a pump signal; said transfer transistor having a gate terminal connected to said output of the second CMOS inverter.

2. Generator circuit according to claim 1, wherein each of said transistors of the first conduction type have a substrate region connected to said source terminal thereof.

3. Generator circuit according to claim 1, wherein each of said transistors of the first conduction type have substrate regions connected to a trough voltage being at least as high as the maximum potential occurring in the generator circuit.

4. Generator circuit according to claim 1, wherein said inverters also have other transistors of a second conduction type opposite to said first conduction type, said other transistors having interconnected substrate regions and source terminals.

5. Generator circuit according to claim 1, wherein said inverters also have other transistors of a second conduction type opposite to said first conduction type, said other transistors having substrate regions connected to a separate substrate bias voltage.

6. Generator circuit according to claim 1, wherein said inverters also have other transistors of a second conduction type opposite to said first conduction type, said transistors of said second conduction type each having a substrate with a trough of said first conduction type therein, and each of said transistors of said first conduction type having substrate regions disposed in said trough.

7. Generator circuit according to claim 1, wherein said transistors of said first conduction type each have a substrate with a trough of a second conduction type opposite said first conduction type therein, and said inverters also have other transistors of said second conduction type having substrate regions disposed in said trough.

* * * * *